US005911116A

United States Patent [19]
Nosswitz

[11] Patent Number: 5,911,116
[45] Date of Patent: Jun. 8, 1999

[54] TRANSMITTING-RECEIVING SWITCH-OVER DEVICE COMPLETE WITH SEMICONDUCTORS

[75] Inventor: Manfred Nosswitz, Munich, Germany

[73] Assignee: Temic Telefunken microelectronic GmbH, Heilbronn, Germany

[21] Appl. No.: 08/799,298

[22] Filed: Feb. 13, 1997

[30] Foreign Application Priority Data

Mar. 19, 1996 [DE] Germany .................. 196 10 760

[51] Int. Cl.⁶ ........................................ H04B 1/44
[52] U.S. Cl. ........................ 455/83; 455/82; 455/84
[58] Field of Search ................. 455/78, 79, 80, 455/82, 83, 84, 107; 333/101, 103, 104, 105

[56] References Cited

U.S. PATENT DOCUMENTS

| | | |
|---|---|---|
| 4,853,972 | 8/1989 | Ueda et al. . |
| 5,047,674 | 9/1991 | Clark et al. . |
| 5,054,114 | 10/1991 | Erickson . |
| 5,193,218 | 3/1993 | Shimo . |
| 5,280,633 | 1/1994 | Camiade et al. . |
| 5,521,561 | 5/1996 | Yrjola et al. ................. 455/80 |
| 5,678,199 | 10/1997 | Birth et al. .................. 455/80 |

FOREIGN PATENT DOCUMENTS

| | | |
|---|---|---|
| 3203961 | 8/1983 | Germany . |
| 261901 | 11/1988 | Germany . |
| 3921102 | 1/1991 | Germany . |
| 4313211 | 10/1993 | Germany . |
| 4342249 | 6/1994 | Germany . |
| WO92 22937 | 12/1992 | WIPO . |

OTHER PUBLICATIONS

LMX–PR–014, muRata, Multilayer Component Dept., New Business Development Division, Jun. 1994.

*Primary Examiner*—Reinhard J. Eisenzopf
*Assistant Examiner*—Sam Bhattacharya
*Attorney, Agent, or Firm*—W. F. Fasse; W. G. Fasse

[57] ABSTRACT

A transmitting-receiving switch-over circuit arrangement for a transceiver includes a transmitter terminal (TX) and a receiver terminal (RX) connected by respective transmitting and receiving circuit sections to a circuit junction point (P) that is coupled to an antenna terminal (ANT). A controllable semiconductor switch (D1, D4, D6) is connected to the transmitting circuit section. A further controllable semiconductor switch (D2, D3, D5, D7) is connected to the receiving circuit section. Control signals are applied to the semiconductor switches so that at least the semiconductor switch connected to the receiving circuit section is controllable independently to assume any one of three stages, namely: fully passing the received RF-signal, fully blocking the received RF-signal, and attenuating the received RF-signal.

13 Claims, 2 Drawing Sheets

STATE OF THE ART

TRANSMITTING-RECEIVING SWITCH-OVER DEVICE COMPLETE WITH SEMICONDUCTORS

FIELD OF THE INVENTION

The invention concerns a transmitting-receiving switch-over device for connecting a high or radio frequency transmitter output terminal or a receiver input terminal to an antenna terminal. A controllable semiconductor element forming a radio-frequency switch is provided in each transmission path from the transmitter output terminal to the antenna terminal and in the reception path from the antenna terminal to the receiver input terminal. Each radio frequency switch has a terminal for feeding a control signal (current or voltage) to the respective semiconductor element. Each of the semiconductor elements form a controllable ohmic resistor for the radio-frequency to be switched in response to the respective control signal.

BACKGROUND INFORMATION

German Patent Publication DE 32 03 961 C2 discloses an electronic transmitting-receiving switch for a transceiver, wherein the switch uses current-controlled diodes. Transceivers equipped with such switch-over devices reduce the level of a very powerful radio frequency reception signal in the first radio frequency amplifier stage of the receiver. An attenuator required for this purpose uses pin diodes which, above a predefined radio frequency level, e.g 1 MHz, form an essentially ohmic resistor for the radio frequency. The ohmic resistor is adjustable by means of a direct current flowing through the pin diode. If no direct current flows through the pin diode, the pin diode will be a high ohmic resistance for the radio frequency. Instead of using pin diodes it is possible to use GaAs field effect transistors for such attenuators.

A radio frequency diode switch, intended for use as a transmitting-receiving switch-over device, is also known from a leaflet by muRata, Multilayer Component Dept., New Business Development Division, publication no. LMX-PR-014, dated June 1994. This switch-over device features two diodes and two quarter-wave (λ/4) conductor sections. Radio frequency terminals are provided for the transmitter, the receiver, and the antenna. In addition there are two control terminals to which the voltages +5 volts and 0 volts are applied for transmitting, and the voltages 0 volts and +5 volts are applied for receiving. A direct current flows through both diodes during transmission for making the path from the transmitter to the antenna conductive while RF-shorting the receiver input. However, when the other polarity of the voltage is applied to the control terminal of both diodes the transmitting path is blocked and the radio frequency thus can only get from the antenna terminal to the receiver.

It is also known to lower the receiving level within the area of the first receiver stage, to use a dual gate MOS FET instead of a pin diode specifically provided for this purpose. The control signal is applied to gate 2 of the dual gate MOS FET. Other known possibilities relate to using a GaAs FET with a gate voltage control, or a transistor with an operating point adjustment, or even to switch off or over one or several transistor stages, e.g. by RF relays (two stage control). Particular effort and expenditure are required for these several possibilities.

The known solutions have the disadvantage that they require at least one additional circuit involving related costs and space requirements. Problems may also occur with intermodulation and cross-modulation. The additional electronic components contribute additional electronic noise. For achieving a more favorable intermodulation and cross-modulation characteristic, only the above-mentioned two-stage control device is possible among the known possibilities.

SUMMARY OF THE INVENTION

The object of the invention is to construct a device of the type described above, in such a way that it is possible to lower the level of the radio frequency input signal, effective in a connected receiver, whereby the number of components is reduced compared to the arrangement described above.

According to the invention at least one of the semiconductor elements is controllable independently of the other semiconductor element such that, when the receiver terminal is coupled to the antenna terminal, the radio frequency power which can be fed to the receiver terminal, will be adjustable by controlling said at least one semiconductor element.

According to the invention it is thus possible to lower the level of the received RF signal by using RF components contained anyway in the transmitting-receiving switch-over device (pin diodes or gallium arsenide FETs), or to use one of these elements. This feature obviates any need for the additional effort expense required in connection with known devices, whereby cost savings and a reduced space requirement is achieved. No additional electronic noise is produced. It is now possible to continuously control or regulate the RF power coming from the antenna and fed to the receiver while achieving a good intermodulation and cross-modulation.

The invention can be applied to any type of transmitting-receiving switch-over device. If pin diodes are used, it is understood that only a radio frequency can be employed that is high enough to assure that the pin diode forms an essentially ohmic resistor for said RF frequency. The lower limit frequency of the pin diode is determined by doping at the manufacturing stage. An application area in which the invention can be used to advantage is seen in TDMA transceivers (TDMA=times division multiplex access). In TDMA transceivers, transmission and reception does not take place simultaneously; rather, either transmission or reception takes place. In the transmitting time or receiving time slots of TDMA radio systems such as IS-54, IS-136, GSM, DCS1800, PDC, CT2/CT2+, DECT, PHS data packets are either transmitted or received during usually very short time slots. In connection with GSM (in Germany: D1-/D2-networks), the data packets transmitted or received have a duration of 0.57 milliseconds. The operating frequency is approximately 900 MHz.

In such devices, for instance, the transmitter can be connected to the antenna for 0.5 milliseconds (ms), and for 0.5 ms the receiver will then be connected to the antenna, and so forth. Although in this connection the control signal driving the switch-over device is an impulse signal, this control signal will be referred to hereinafter also as a direct current or direct voltage signal because the controllable semiconductor elements have a characteristic that does not significantly differ from their characteristic in response to direct voltage or direct current control signals.

One embodiment of the invention provides for both above-mentioned semiconductor elements to be controllable independently of each other. This feature opens up possibilities beyond the normal transmitting/receiving switch-over. In other embodiments of the invention, the control unit depends on the characteristics of the semiconductor elements present in the transceiver.

In another embodiment of the invention a first semiconductor element is connected into the radio frequency path from the transmitter terminal to a branch point where the radio frequency path from the transmitter terminal to the antenna terminal meets the radio frequency path from the antenna terminal to the receiver terminal. The branch point is connected to RF ground by a first low pass filter that passes direct current, preferably a first quarter-wave (λ/4) transformation element. The first semiconductor element has a control terminal that is not connected to said junction point but is connected to receive a first control signal applied through a second low pass filter preferably a second quarter-wave (λ/4) transformation element for switching the first semiconductor element into the RF transmission mode to pass radio frequency to the antenna or to inhibit the transmission mode to permit a receiving mode. The receiver terminal is connected to a second semiconductor element having at least one further control terminal connected to receive a second control signal for switching the second semiconductor element to a high-impedance or to low-impedance state for the radio frequency, in order to prevent or permit the transmission of radio frequency to the receiver terminal, or to reduce the level of the radio frequency signal supplied to the receiver terminal, whereby the reduction of the received radio frequency signal level can be reduced by simple means.

The above mentioned quarter-wave (λ/4) transformation elements can be a well known quarter-wave (λ/4) conductor section. Feeding the control signal through the low pass filters includes embodiments wherein the low pass filter terminal on the opposite side of the branch point, is connected to ground, or separated from ground by a capacitor, connecting the low pass filter terminal to a constant operating voltage other than 0 volts. Since the invention is used, among other ranges, in the 900 MHz frequency range, the low pass filter which in lower frequency ranges could be a choke, for instance, will hereinafter mostly be referred to as a quarter-wave (λ/4) conductor section in order to simplify matters.

The various embodiments of switching circuits according to the invention can be operated by different control signal feed-in possibilities. In one of these embodiments, one terminal of the second semiconductor element is connected to the receiver terminal while the other terminal of the second semiconductor element is connected to ground for a controlled transmittal of a radio frequency receiver signal to the receiver terminal. For such control said one terminal is connected to ground for a direct current control, or to a direct current voltage other than 0 volts, or to a control signal source. Another possibility for controlling of the first and second semiconductor elements which form the respective radio frequency switches, the first and/or second quarter-wave (λ/4) transformation element is connected to ground for a direct current control operation or to a direct current voltage other than 0 volts for a respective control operation, or to a control signal source for a switch control by a respective control signal. TO effect a direct current separation, capacitors will be connected into the circuit wherever necessary. The just mentioned control possibilities may be applied singly or in combination with each other. The control ground, or voltage, or signal will be applied to the terminal that can be grounded for the RF signal by the respective control operation.

The invention also comprises a radio frequency transceiver which is equipped with a transmitting-receiving switch-over device according to the invention.

The invention also includes a procedure for controlling a transmitting-receiving switch-over device such that the radio frequency level at the receiver terminal is limited to a preset maximum value. This limitation is achieved by a radio frequency closed loop attenuation control. In addition to reception without attenuation, frequently just one discrete attenuation value suffices (e.g. −20 dB or −30 dB), adjustable by a control voltage or control current. If required, it will then be possible to expand the receiver dynamics of, e.g. 80 dB, by the attenuation value. The interrelation of the control voltage of the control current and the attenuation must be known exactly for determining the receiving radio frequency level at the antenna terminal of the transmitting-receiving switch-over device in the radio frequency transceiver.

BRIEF FIGURE DESCRIPTION

Further features and advantages of the invention result from the following description of embodiment examples of the invention referring to the drawings which show essential details of the invention, and from the claims. In any embodiment of the invention, the various single features may be implemented either individualy or in any combination.

The Figures show:

FIG. 1 a schematic circuit diagram, partly in block format, of a transceiver according to the invention, equipped with a transmitting-receiving switch-over device of the invention wherein each of two pin diodes is controllable completely independently of the other;

FIG. 2 a second embodiment of a transmitting-receiving switch-over device featuring a completely separate controllability of the two pin diodes, whereby a transceiver requires minor modifications for the implementation of this embodiment;

FIG. 3 a third embodiment of a transmitting-receiving switch-over device including a stepwise positive controllability;

FIG. 4 a fourth embodiment of a transmitting-receiving switch-over device including a stepwise negative controllability; and FIG. 5 a known circuit of a transmitting-receiving switch-over device.

DESCRIPTION OF THE PREFERRED EMBODIMENTS

In all figures the antenna terminal of the transmitting-receiving switch-over device provided for connecting an antenna, is designated as ANT. The receiver input terminal is designated as RX. The transmitter output terminal is designated as TX. The arrangements are shown for essentially narrow-band applications so that the quarter-wave (λ/4) terminal conductor sections provided in all arrangements shown here, will have their essential transformation characteristics across the entire relevant radio frequency range, namely for example transforming a short-circuit at the output into a very high resistance at the input of the relevant quarter-wave (λ/4) conductor section. The quarter-wave (λ/4) conducor sections L1, L2, L3, L4 and L5 are shown as respective quarter-wave (λ/4) windings designated as such.

Figure 5:
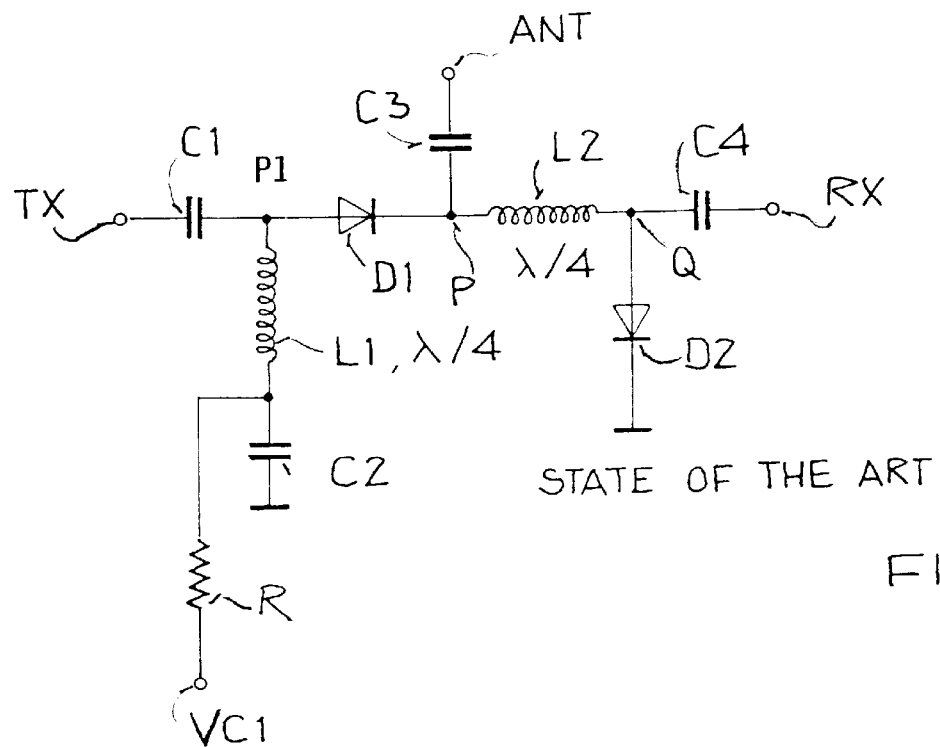

In the known arrangement according to FIG. 5, the transmitter terminal TX is connected to a circuit junction point P1, by an RF coupling capacitor C1. The junction point P1 is connected to ground by a quarter-wave (λ/4) conductor section L1 and a capacitor C2. Point P1 is further connected to the anode of a first pin diode D1 which forms a first controllable radio frequency switch. The cathode of the diode D1 is in its turn connected to a circuit junction point P which is connected to an antenna terminal ANT by a coupling capacitor C3, to a junction point Q by a quarter-wave (λ/4) conductor section L2. The junction point Q is connected to a receiver terminal RX by a coupling capacitor C4. The junction point Q is further connected to the anode of a second pin diode D2 whose cathode is connected to ground. The junction point P1 of the quarter-wave (λ/4) conductor section L1 with the capacitor C2 is connected by an ohmic resistor R operating as a current limiter to a control voltage source VC1 with positive polarity. The other terminal of the voltage source is connected to ground. If the control voltage VC1 is applied to the resistor R, a direct current will flow through both pin diodes D1 and D2 in the pass direction. Therefore, both pin diodes will have a low resistance for a radio frequency signal, whereby a radio frequency path from the transmitter terminal TX to the antenna terminal ANT is established for transmitting a radio frequency signal to the antenna. However, there exists almost a short-circuit between the receiver terminal RX and ground through the diode D2 so that a radio frequency (RF) signal cannot get to the receiver terminal RX. This blocking of the RF signal is enhanced by the second quarter-wave (λ/4) conductor section L2.

If no control voltage is applied through the control voltage source VC1 (VC1=0 volts), then both pin diodes D1 and D2 constitute a high-impedance for the radio frequency signal so that, on the one hand, the path from transmitter terminal to antenna terminal is blocked, and, on the other hand, the circuit from the antenna terminal ANT to receiver terminal RX is closed to form a path for the radio frequency receiver signal. The input resistance of a receiver 16 connected to the receiver terminal RX will generally correspond to the wave resistance of the radio frequency conductors used. Both pin diodes D1 and D2 will be simultaneously switched over between a high-impedance and a low-impedance state. Hence, not even one of these diodes can be controlled independently of the other diode.

Contrary to the foregoing it is an essential feature of the invention that the pin diode provided for the receiver input RX, or generally, the semiconductor element provided for the receiver input RX and forming a switchable ohmic resistor for the radio frequency (e.g. a GaAs-FET), is implemented so that in the receiving mode the respective second controllable semiconductor radio frequency switch passes a weak radio frequency input signal power coming from the antenna terminal ANT to the receiver terminal RX as unattenuated as possible. However, if the radio frequency signal power level received from the antenna is too high for trouble-free processing, the ohmic resistance of the controllable semiconductor element or switch provided for the receiver terminal RX is so controlled as to reduce the radio frequency power fed to the receiver terminal RX. This attenuation of the incoming radio frequency receiver signal will normally not completely suppress the receiver signal supplied to the receiver terminal RX.

In the embodiments shown here, the semiconductor element provided for the receiver terminal RX is connected in parallel to the latter. In this case, for the purpose of controlling or regulating the signal level of the receiver input signal, the controllable semiconductor element will be controlled, according to the invention, so that, in the event of the antenna signal being too powerful, and starting from a very high ohmic value, the ohmic resistance of the semiconductor element will decrease, without, however, normally assuming the value 0.

According to the invention a controllable semiconductor element may be arranged in series in the radio frequency receiver path from the antenna terminal ANT to the receiver terminal RX. This receiver path is also referred to as receiving second circuit section. If the radio frequency signal level coming from the antenna terminal ANT is too powerful, the ohmic resistance of this semiconductor element would be increased, starting from a very low value, without, however, normally reaching an extremely high value characteristic for the inhibited state. In such a case the quarter-wave (λ/4) conductor section L5 connected between the antenna terminal ANT and receiver terminal RX should be replaced by a very short conductor length or by a (λ/2) conductor section.

Figure 1:
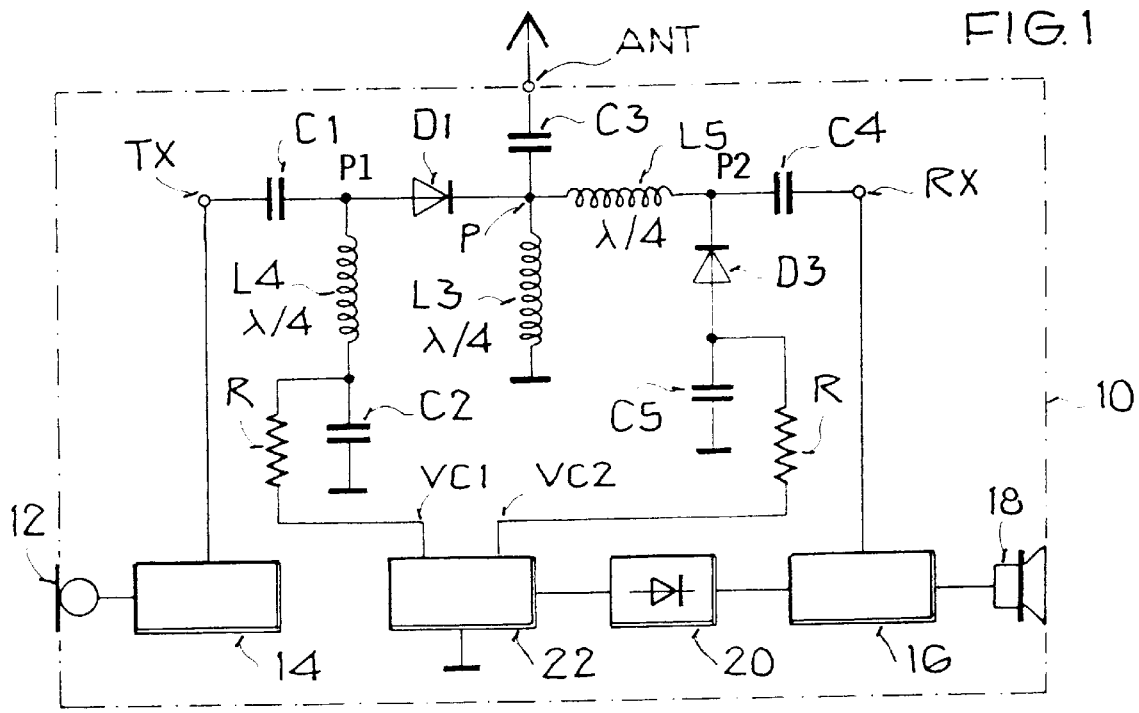

In the arrangement according to the invention shown in FIG. 1, the transmitting-receiving switch-over circuit comprises the components shown in FIG. 5, however the second pin diode D3 is connected to the receiving circuit section with its polarities reversed so that the cathode of D3 is connected to junction P2 in the receiver circuit section. Further, the junction point P is connected to ground by a quarter-wave (λ/4) conductor section L3. The quarter-wave (λ/4) conductor section L1 of FIG. 5 is designated in FIG. 1 as a further quarter-wave (λ/4) conductor section L4. The quarter-wave (λ/4) conductor section L2 of FIG. 5 is designated in FIG. 1 as quarter-wave (λ/4) conductor section L5. The quarter-wave (λ/4) conductor section L3 provides, according to the invention, two separate direct current paths for controlling the pin diodes D1 and D3. The conductor section L3 could be formed by any other suitable radio frequency cut-off device. The anode of diode D3 is connected to ground by a capacitor C5, and through a resistor R to a terminal VC2 of a control voltage source 22. The control voltage source 22 is connected to ground.

The circuit arrangement according to the invention as shown in FIG. 1 provides the following switching possibilities.

Both control voltages VC1 and VC2 are positive (e.g. +5 volts): A direct current will flow through both pin diodes D1 and D3, whereby the transmission mode is established as described above with reference to FIG. 5.

Both control voltages VC1 and VC2 are zero (0) volts: There is no direct current flowing through both pin diodes so that their effective resistance in respect to the radio frequency is very high, whereby the receiving mode is established as described above with reference to FIG. 5.

The control voltage VC1 equals 0 volts and the control voltage VC2 is positive, but lower than is necessary for the switch-over circuit to assume the transmission mode. Under these conditions the switch-over circuit is in the receiving mode; but the receiver terminal RX will not receive the full radio frequency power coming from the antenna because the ohmic resistance of pin diode D3 is so low that it shunts a noticeable portion of the radio frequency power to ground or dissipates that power portion as heat in D3. In other words, the ohmic resistance of D3 is not sufficiently high enough to allow the entire received radio frequency power to reach the receiver terminal RX.

The block diagram of FIG. 1 further shows those transceiver components which are essential for understanding the invention, e.g. the components of a radio telephone accommodated in a single housing 10. The housing 10 does not show the actual shape of the telephone due to the simplified block representation in FIG. 1. A microphone 12 is fitted in the housing 10. The amplifier 10 amplifies the speech signals coming from the user by means of a transmitter unit 14 (amplifier and transmitter arrangement) and transforms the speech signals into suitably modulated radio frequency that can be fed through a conductor to the transmitter terminal TX. The receiver terminal RX is connected through a conductor to an input of the receiver unit 16 (receiver amplifier, and demodulator, as well as an LF amplifier) which, using appropriate data packet demodulation, supplies a loudspeaker or receiver set 18, by means of which the user can hear the messages received. The receiver unit 16 includes a device 20, shown as a block outside the receiver unit 16 for the sake of clarity, for supplying an output signal which is a measure of the received RF signal level coming from the antenna and fed to the receiver terminal RX. Thus, the device 20 functions as a sensor for said received RF signal level. The output signal of device 20 is fed to a control device 22 containing a timing or clock generator which in the manner described above, continuously switches the transmitting-receiving switch-over circuit arrangement between the transmission and receiver modes. Additionally, the device 20, depending on the output signal supplied by device 20, will feed to the terminal VC2 a voltage as high as is required for the respective attenuation of the received RF signal. The output signal of the device 20 is a measure of the power level of the received RF signal.

The grounded control device 22 has output terminals VC1 and VC2 which provide respective control signals through two separate control conductors to the transmitting-receiving switch circuit arrangement.

The quarter-wave (λ/4) conductor section L4 on the transmitter side is only used as a low pass filter conducting direct current. The quarter-wave (λ/4) conductor section L5 on the receiver side, has known transformation characteristics which are used for different terminal resistances as known.

In the arrangement according to FIG. 1 the control voltages or signals VC1 and VC2 are positive relative to ground. However, the arrangement shown in FIG. 2 has been modified so that the control voltages VC1 and VC2 must be negative, for causing a current to flow in the pass direction through the respective pin diodes D4 and D5. Contrary to FIG. 1, the quarter-wave (λ/4) conductor section L3 in FIG. 2 does not have a direct current connection to ground but is grounded for radio frequency signals by a capacitor C6. A positive operating voltage (+) may be applied to the junction between the quarter-wave (λ/4) conductor section L3 and the capacitor C6. The control voltages at the respective terminals VC1 and VC2 can now be either negative relative to ground in order to cause a forward current flow through the respective pin diodes D4 and D5, or the control voltages VC1 and VC2 can be positive relative to ground but must be lower compared to the positive direct voltage or operating voltage (+) applied to the quarter-wave (λ/4) conductor section L3 so that also in this case a direct current will flow through diodes D4 and D5. Thus, in the circuit of FIG. 2 it is also possible to switch back and forth between the transmission mode and the receiving mode by applying suitable control voltages through the terminals VC1 and VC2. Further, in the receiving mode the ohmic resistance of the diode D5 which is effective for radio frequency receiver signals is controllable toward lower values starting from a very high ohmic resistance value in order to attenuate the radio frequency signal power level supplied to receiver terminal RX.

Figure 2:
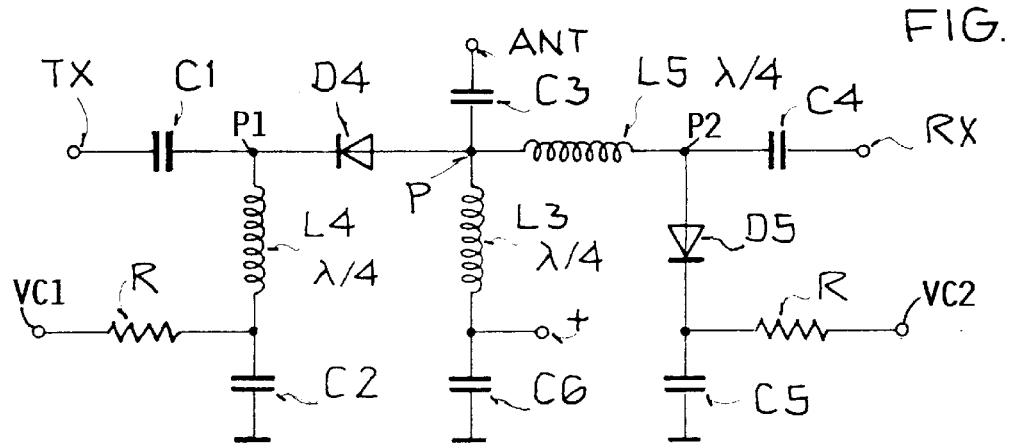

In the arrangement according to FIG. 2, the pin diodes D4 and D5, respectively, are connected in the circuit with a reverse polarity compared to the arrangement of FIG. 1.

Figure 3:
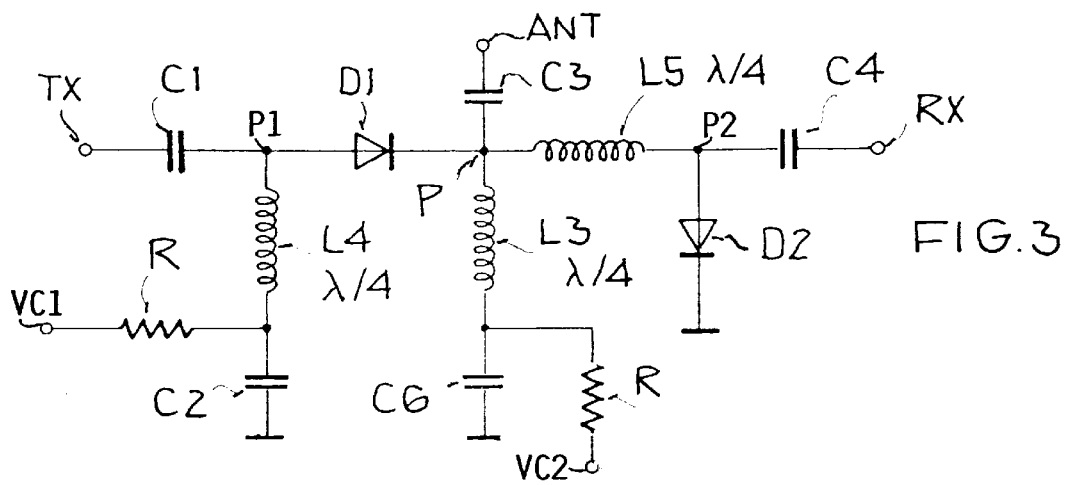

In the circuit arrangement of FIG. 3, the pin diodes D1 and D2 are connected in circuit with the same polarity as in the known arrangement of FIG. 5. The quarter-wave (λ/4) conductor section L4 is connected to the first control voltage VC1 as in FIG. 5. However, in accordance with FIGS. 1 and 2, the quarter-wave (λ/4) conductor section L3 is connected to the junction point P to which the diode D1, the quarter-wave (λ/4) conductor section L5 and the antenna coupling capacitor C3 are also connected. The other terminal of the quarter-wave (λ/4) conductor section L3 is connected to the control voltage or terminal VC2 by a resistor R as in FIG. 2 and the capacitor C6 blocks a direct current flow to ground, whereby this terminal VC2 can feed a current into the lower end of the conductor section L3. If the voltage VC1 is positive, and the voltage VC2 is 0 volts, then a direct current will flow through both diodes D1 and D2, and the arrangement is switched to the transmission mode as described above. If the voltage VC1 is 0 volts, and the voltage VC2 is also 0 volts, then the arrangement is switched to the receiving mode, whereby the RF power of the receiver signal flowing from the antenna to the receiver input RX is not attenuated. If the control voltage VC2 is now increased from 0 toward positive values, a direct current increasing from 0 will flow through the diode D2, whereby the ohmic resistance of the diode D2 will be reduced toward lower values so that the radio frequency power supplied to the receiver terminal RX is correspondingly attenuated.

Figure 4:
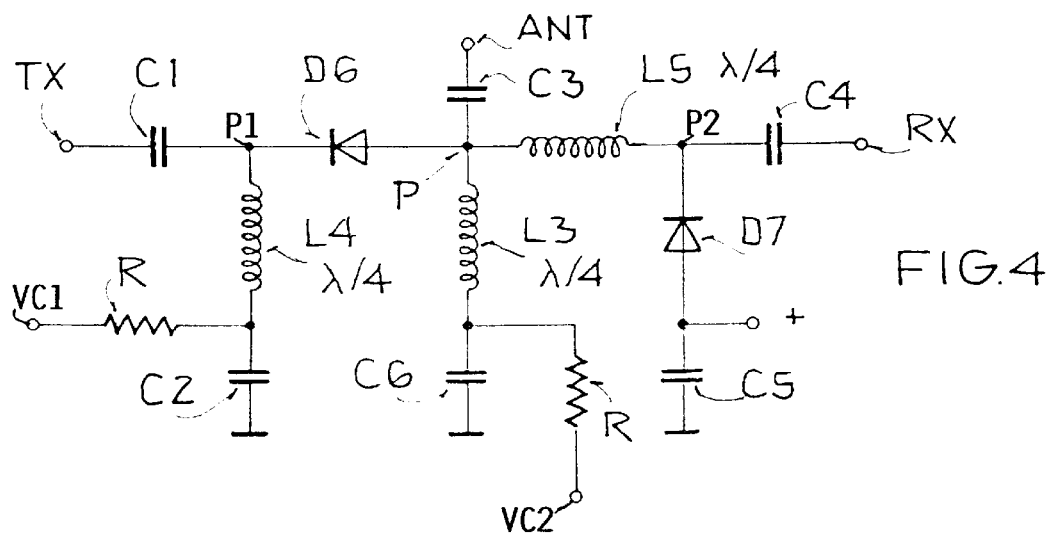

In the circuit arrangement of FIG. 4, the pin diodes D6 and D7 are connected in the circuit with a reverse polarity compared to the diodes in the circuit of FIG. 3. The anode of the diode D7 is connected to ground by the capacitor C5 as in FIG. 2. A positive supply voltage (+) is connected or connectable to the anode of the diode D7. The lower ends of the quarter-wave (λ/4) conductor sections L3 and L4 are connected to the same components as in the circuit arrangement of FIG. 3. However, the control voltages VC1 and VC2 at the respective control terminals in FIG. 4 must be selected as follows:

For establishing the transmission mode, the control voltage VC1 must have a value which is sufficiently smaller (toward negative values) than the voltage (+) fed to the anode of the diode D7, so that both diodes D6 and D7 assume a low-impedance state relative to the radio frequency used.

For establishing the receiving mode without attenuation of the RF signal power level fed to the receiver terminal RX, both control voltages VC1 and VC2 must, for example, be disconnected from the respective terminals or source so that it is not possible for a direct current to flow through diodes D6 and D7. For establishing the receiving mode with an attenuation of received RF signal power level the control voltage VC1, for example, is to be disconnected from a supply voltage source so that it is not possible for a direct current to flow through the diode D6, thereby switching off the radio frequency transmitter signal. Further, the control voltage VC2 must have such a value that a direct current flows through diode D7 which direct current is so low that a portion of the radio frequency receiver signal power is shunted to ground through the diode D7; and any remaining portion of the receiver signal power is available at the receiver terminal RX.

All circuit arrangements according to the invention as illustrated in the above example embodiments are equipped with pin diodes. Instead of pin diodes it is, however, possible to use other semiconductor elements which are controllable as ohmic resistors for the radio frequency used. Such semiconductor elements include in particular GaAs field effect transistors.

In the example embodiments according to the invention as shown in FIGS. 1 to 4, it is possible by appropriate selection of control currents or control voltages which deviate from the values described above, to pass the radio frequency transmitter signal directly from the transmitter terminal TX to the receiver terminal RX. Normally, such transmission is undesirable, since it may even damage the receiver unit. Therefore, such direct transmission should be prevented by a suitable circuit construction in particular of the control device 22. In some cases, however, it may be useful to utilize this option, e.g. for test purposes. For example, the transceiver equipped according to the invention could be provided with a test button that would decrease the level of the radio frequency power generated by the transmitter to an extremely low level and then transmit the low level signal directly to the receiver terminal. In this way, users or service personnel would be enabled to carry out a rough assessment regarding the operability of the transmitter and receiver units. This assessment could be effected directly on the device, without any need for a separate measuring instrument.

For the invention it is not necessary that diode D1 and quarter-wave ($\lambda/4$) conductor section L4 are located outside the transmitter unit 14, as shown in the illustrations. If the transmitter unit 14 is constructed so that during transmission intervals it will control a switch corresponding to the diode D1 located within the transmitter unit to become conductive, or if the transmitter unit 14 is constructed so that it feeds a direct current to the diode D1 in FIGS. 1 to 4, then such arrangements will also be operational and are included in the invention because they also contain a transmitting-receiving switch-over circuit arrangement.

Although the invention has been described with reference to specific example embodiments, it will be appreciated that it is intended to cover all modifications and equivalents within the scope of the appended claims It should also be understood that the present disclosure includes all possible combinations of any individual features recited in any of the appended claims.

What is claimed is:

1. A transmitting-receiving switch over circuit arrangement comprising:
    (a) a circuit junction point (P),
    (b) a transmitter output (TX) for providing a radio frequency transmitter output signal,
    (c) a transmitting first circuit section connecting said transmitter output (TX) to said circuit junction point (P) for transmitting said radio frequency transmitter output signal to said circuit junction point (P),
    (d) an antenna output terminal (ANT) coupled to said circuit junction point (P) for transmitting said radio frequency transmitter output signal or for receiving a radio frequency receiver input signal,
    (e) a receiver input terminal (RX) for receiving said radio frequency receiver input signal,
    (f) a receiving second circuit section connecting said receiver input terminal (RX) to said circuit junction point (P) for feeding said radio frequency receiver input signal to said receiver input terminal (RX),
    (g) a controllable first semiconductor radio frequency switch (D1, D4, D6) connected to said transmitting circuit section,
    (h) a first control input (VC1) connected to said first semiconductor radio frequency switch (D1, D4, D6) for supplying a first control signal to said first semiconductor radio frequency switch (D1, D4, D6) to close or open said first semiconductor frequency switch (D1, D4, D6),
    (i) a controllable second semiconductor radio frequency switch (D2, D3, D5, D7) connected to said receiving circuit section, and
    (j) a second control input (VC2) connected to said second semiconductor radio frequency switch (D2, D3, D5, D7) for supplying a second control signal to said second semiconductor radio frequency switch (D2, D3, D5, D7) for controlling said second semiconductor radio frequency switch to assume any one of three stages: open for blocking said receiver input signal, closed for passing said receiver input signal, and attenuated for damping said receiver input signal, whereby at least said second controllable semiconductor radio frequency switch (D2, D3, D5, D7) is controllable independently of any control of said first semiconductor radio frequency switch (D1, D4, D6).

2. The circuit arrangement of claim 1, further comprising a first quarter wavelength transformation element or conductor section (L4) connected at one end to said transmitter circuit section and to one terminal of said first radio frequency switch, a capacitor (C2) coupling another end of said first quarter wavelength transformation element or conductor section (L4) to radio frequency ground, a second quarter wavelength transformation element or conductor section (L3) having one end connected to said circuit junction point (P) and to another terminal of said first radio frequency switch, said second quarter wavelength transformation element or conductor section (L3) having a second end connected to said radio frequency ground, and wherein said first control input (VC1) is connected to a junction between said first quarter wavelength transformation element (L4) and said capacitor (C2) for feeding a control signal to said first radio frequency switch (D1, D4, D6) to open or close said first radio frequency switch for said radio frequency transmitter signal.

3. The circuit arrangement of claim 2, wherein at least one RF-grounded end of at least one of said first and second quarter wavelength conductor sections (L4, L3) is connected in operation to any one of: a ground connection for a direct current control, to a direct voltage other than 0 volts, and to a control signal source coupled to any one of said first and second control inputs (VC1, VC2).

4. The circuit arrangement of claim 1, wherein said receiving second circuit section connects one terminal of said second semiconductor radio frequency switch (D5) to said receiver input terminal (RX) through a capacitor (C4), wherein the other terminal of said second semiconductor radio frequency switch (D5) is grounded by a capacitor (C5), and wherein said other terminal of said second semiconductor radio frequency switch (D5) is connected to said second control input (VC2) for applying to said second semiconductor radio frequency switch (D5) any one of: a ground connection, a direct control voltage other than 0 volts, and a control signal source, whereby said second semiconductor radio frequency switch is operated to open or close for said receiver input signal or to attenuate said receiver input signal.

5. The circuit arrangement of claim 1, wherein at least one of said first and second semiconductor radio frequency switch is a pin diode.

6. The circuit arrangement of claim 1, further comprising a radio frequency signal level sensor (20) connected to said receiver input terminal (RX) for determining a signal level of said radio frequency receiver input signal and for producing a control signal for said second semiconductor radio frequency switch (D2, D5, D7) for attenuating said radio frequency receiver input signal to a preset maximum receiver input signal level.

7. The circuit arrangement of claim 1, further comprising a receiver section (16, 18), and wherein said radio frequency signal sensor (20) is part of said receiver section.

8. The circuit arrangement of claim 1, wherein at least one of said first and second semiconductor radio frequency switches is a gallium arsenide field effect transistor.

9. The circuit arrangement of claim 1, comprising control means for controlling said first and second control inputs independently of one another.

10. A transceiver comprising a transmitting-receiving switch-over circuit arrangement according to claim 1.

11. The transceiver of claim 10, further comprising a radio frequency signal level sensor (20) connected to said receiver input terminal (RX) for determining a signal level of said radio frequency receiver input signal for producing a control signal for said second semiconductor radio frequency switch (D2, D3, D5, D7) for attenuating said radio frequency receiver input signal to a preset maximum signal level.

12. A method for operating the transmitting-receiving switch-over circuit arrangement of claim 1, comprising the following steps:

(a) sensing the power level of said receiver input signal to provide an input power level signal, (b) producing a control signal in response to said input power level signal and in response to a preset maximum input signal level, and (c) controlling said second semiconductor radio frequency switch in response to said control signal for attenuating said receiver input signal to said preset maximum input signal level.

13. A method for operating the transmitting-receiving switch-over circuit arrangement of claim 1, comprising the following steps:

(a) presetting a discrete attenuation value for said receiver input signal, (b) providing a control voltage or current signal in response to said discrete attenuation value, and (c) controlling said second semiconductor radio frequency switch in response to said control voltage or current signal for attenuating said receiver input signal in accordance with said discrete attenuation value.

* * * * *

UNITED STATES PATENT AND TRADEMARK OFFICE
CERTIFICATE OF CORRECTION

PATENT NO. : 5,911,116
DATED : June 8, 1999
INVENTOR(S) : Nosswitz

It is certified that error appears in the above-identified patent and that said Letters Patent is hereby corrected as shown below.

Title page,
In [54] the Title, after "DEVICE" delete --COMPLETE--;

Column 1, line 2, after "DEVICE" delete --COMPLETE--;

Column 11, line 1, after "claim" replace "1" by --6--.

Signed and Sealed this

Sixteenth Day of November, 1999

Attest:

Q. TODD DICKINSON

*Attesting Officer*　　　*Acting Commissioner of Patents and Trademarks*